United States Patent
Kono et al.

(10) Patent No.: US 8,686,436 B2
(45) Date of Patent: Apr. 1, 2014

(54) SILICON CARBIDE SEMICONDUCTOR DEVICE

(75) Inventors: Hiroshi Kono, Kanagawa-ken (JP);
Takashi Shinohe, Kanagawa-ken (JP);
Takuma Suzuki, Kanagawa-ken (JP);
Johji Nishio, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/600,532

(22) Filed: Aug. 31, 2012

(65) Prior Publication Data
US 2013/0240904 A1    Sep. 19, 2013

(30) Foreign Application Priority Data
Feb. 29, 2012  (JP) ................... 2012-043648

(51) Int. Cl.
*H01L 29/16*    (2006.01)
(52) U.S. Cl.
USPC ..................... 257/77; 257/E21.954
(58) Field of Classification Search
CPC ............. H01L 29/1608; H01L 29/66068; H01L 29/1602
USPC .............. 257/77, 341, 492, E21.954
See application file for complete search history.

(56) References Cited

U.S. PATENT DOCUMENTS

| | | | | |
|---|---|---|---|---|
| 2008/0135972 A1* | 6/2008 | Ikuta et al. | ..................... | 257/492 |
| 2008/0224150 A1* | 9/2008 | Suzuki et al. | ................... | 257/77 |
| 2009/0096020 A1* | 4/2009 | Yamanobe | ..................... | 257/337 |

FOREIGN PATENT DOCUMENTS

JP    4627211 B2    2/2011

\* cited by examiner

*Primary Examiner* — Nikolay Yushin
(74) *Attorney, Agent, or Firm* — Oblon, Spivak, McClelland, Maier & Neustadt, L.L.P.

(57) ABSTRACT

According to one embodiment, a semiconductor device includes a first semiconductor region, a second semiconductor region, a third semiconductor region, a fourth semiconductor region, an insulating film, a control electrode, a first electrode, and a second electrode. The first semiconductor region includes silicon carbide, and has a first portion. The second semiconductor region is provided on the first semiconductor region, and includes silicon carbide. The third semiconductor region and the fourth semiconductor region are provided on the second semiconductor region, and includes silicon carbide. The electrode is provided on the film. The second semiconductor region has a first region and a second region. The first region contacts with the third semiconductor region and the fourth semiconductor region. The second region contacts with the first portion. The impurity concentration of the first region is higher than an impurity concentration of the second region.

19 Claims, 8 Drawing Sheets

SILICON CARBIDE SEMICONDUCTOR DEVICE

CROSS-REFERENCE TO RELATED APPLICATIONS

This application is based upon and claims the benefit of priority from the prior Japanese Patent Application No. 2012-043648, filed on Feb. 29, 2012; the entire contents of which are incorporated herein by reference.

FIELD

Embodiments described herein relate generally to a semiconductor device.

BACKGROUND

Silicon carbide (SiC) has physical properties which are superior by three times in band gap, by about ten times in breakdown electric field strength, and by about three times in thermal conductivity compared with silicon (Si). Using such characteristics of SiC, it is possible to realize a semiconductor device which has low loss and superior high temperature operation.

In the semiconductor device using SiC, it is desired that on-resistance is decreased and avalanche resistance is enhanced to realize stable breakdown voltage.

DETAILED DESCRIPTION

In general, according to one embodiment, a semiconductor device includes a first semiconductor region, a second semiconductor region, a third semiconductor region, a fourth semiconductor region, an insulating film, a control electrode, a first electrode, and a second electrode. The first semiconductor region includes silicon carbide of a first conductivity type. The first semiconductor region has a first portion. The second semiconductor region is provided adjacent to the first portion on the first semiconductor region. The second semiconductor region includes silicon carbide of a second conductivity type. The third semiconductor region is provided spaced from the first portion on the second semiconductor region. The third semiconductor region includes silicon carbide of the first conductivity type. The fourth semiconductor region is provided on the second semiconductor region. The fourth semiconductor region includes silicon carbide of the second conductivity type. The insulating film is provided on the first semiconductor region, the second semiconductor region and the third semiconductor region. The control electrode is provided on the insulating film. The first electrode is electrically connected to the third semiconductor region. The second electrode is electrically connected to the first semiconductor region. The second semiconductor region has a first region and a second region. The first region contacts with the third semiconductor region and the fourth semiconductor region. The second region contacts with the first portion. The impurity concentration of the first region is higher than an impurity concentration of the second region.

Various embodiments will be described hereinafter with reference to the accompanying drawings.

The drawings are schematic and conceptual, and thus, the relationship between the thickness and width of each part, the ratio between the sizes of respective parts, and the like are not necessarily the same as in real parts. Further, even in a case where the same part is shown, the size or ratio thereof may be differently shown according to the drawings.

Further, in the specification and each drawing, the same elements as those described with reference to the previous drawings are given the same reference signs, and description thereof will be appropriately omitted.

Further, in the embodiments, specific examples in which a first conductivity type is an n-type and a second conductivity type is a p-type will be described.

Further, in the following description, the indications of $n^+$, n, $n^-$, $p^+$, p and $p^-$ represent a relative level of impurity concentration in the respective conductivity types. That is, as the number of + is large, the impurity concentration is relatively high, and as the number of − is large, the impurity concentration is relatively low.

First Embodiment

Figure 1A:
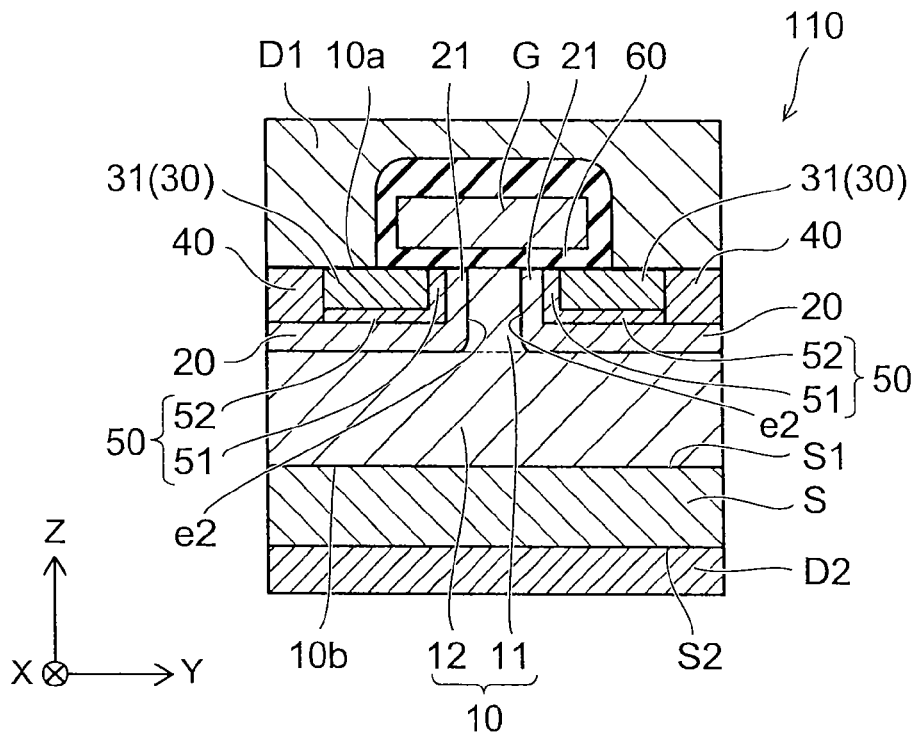
FIGS. 1A and 1B are cross-sectional views schematically illustrating a configuration of a semiconductor device according to a first embodiment.
Figure 1B:
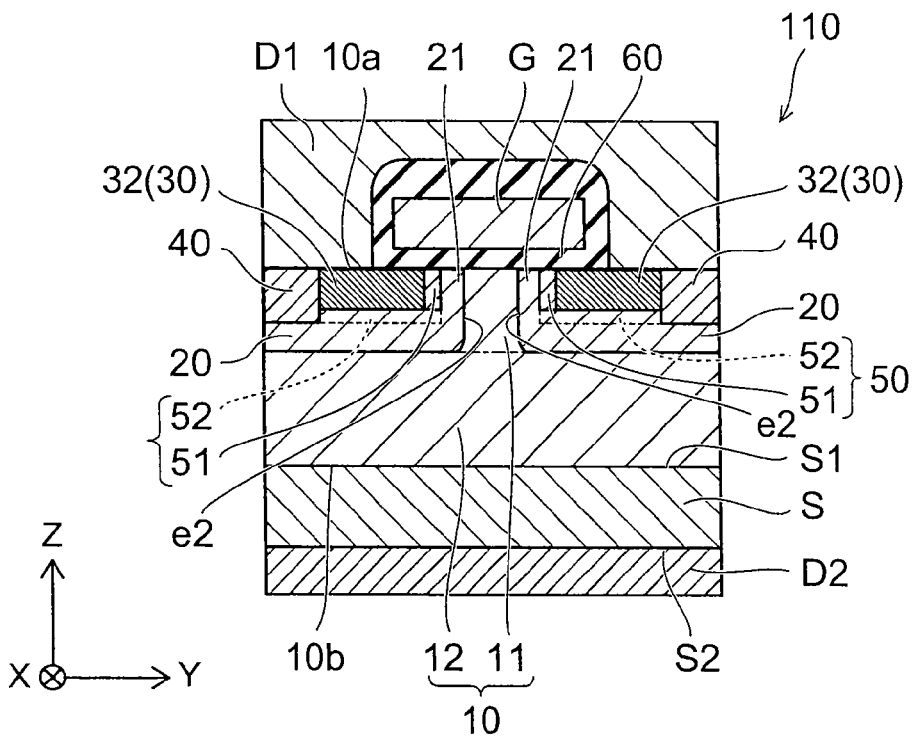

FIGS. 1A and 1B are cross-sectional views schematically illustrating a configuration of a semiconductor device according to a first embodiment.

Figure 2:
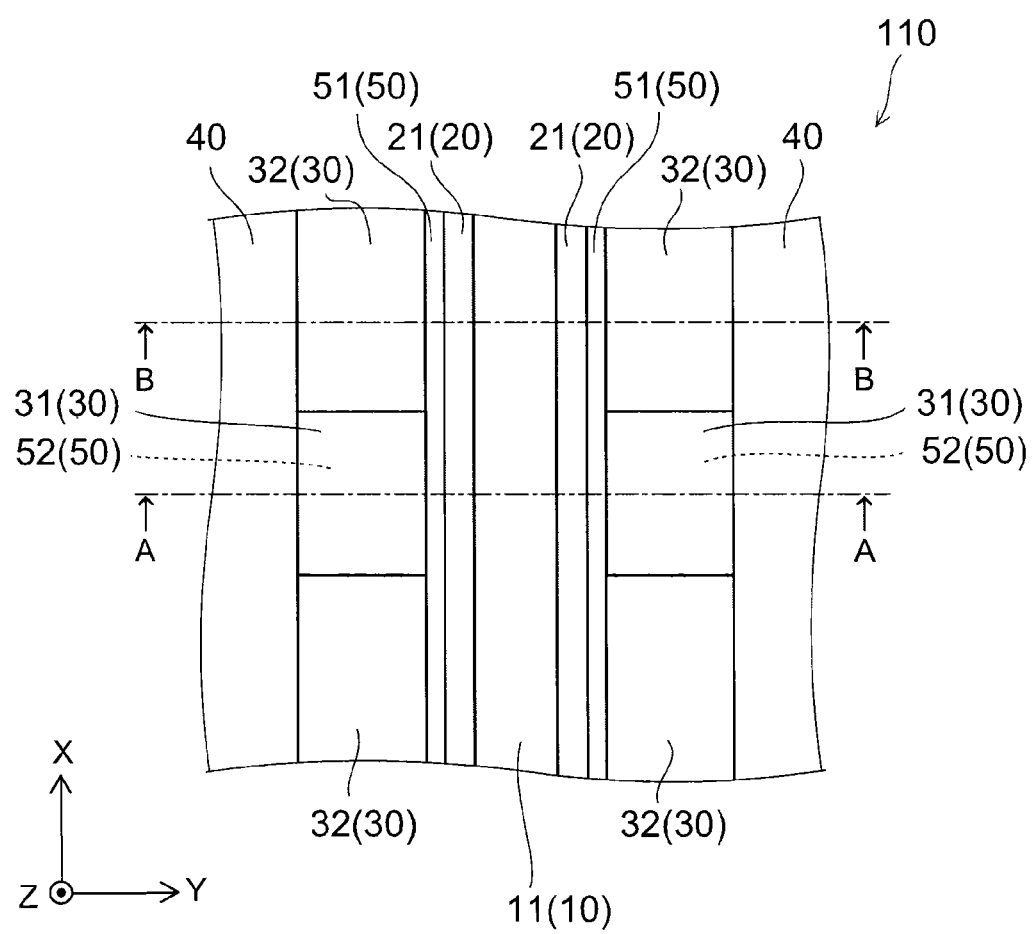
FIG. 2 is a plan view schematically illustrating the configuration of the semiconductor device according to the first embodiment.

FIG. 2 is a plan view schematically illustrating the configuration of the semiconductor device according to the first embodiment.

Figure 3:
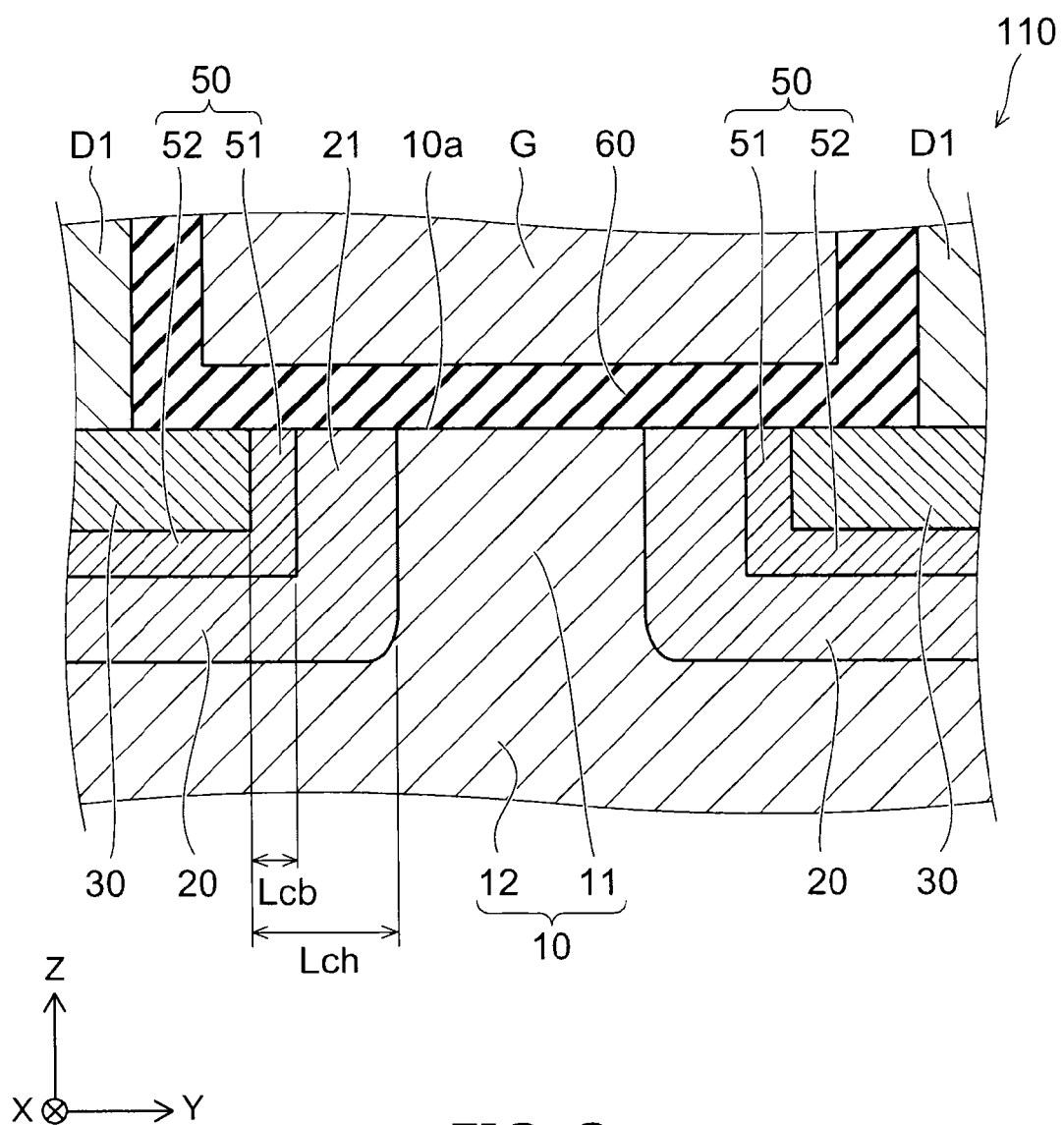
FIG. 3 is an enlarged cross-sectional view schematically illustrating the periphery of a channel.

FIG. 3 is an enlarged cross-sectional view schematically illustrating the periphery of a channel.

FIG. 1A shows a cross-section taken along line A-A shown in FIG. 2, and FIG. 1B shows a cross-section taken along line B-B shown in FIG. 2.

FIG. 3 shows the periphery of the channel in FIG. 1A.

As shown in FIGS. 1A and 1B, a semiconductor device 110 according to the first embodiment includes a first semiconductor region 10, a second semiconductor region 20, a third semiconductor region 30, a fourth semiconductor region 40, an insulating film 60, a control electrode G, a first electrode D1, and a second electrode D2. The semiconductor device 110 according to the first embodiment is a DIMOSFET (Double Implantation MOSFET) using silicon carbide (SiC).

The first semiconductor region 10 includes a first portion 11 which protrudes upward. The first semiconductor region 10 includes SiC of the first conductivity type ($n^-$-type).

In the embodiment, the first semiconductor region 10 is formed on an upper surface S1 of a substrate S which includes SiC of the first conductivity type (n+-type) formed by epitaxial growth, for example.

Here, in the embodiment, a direction orthogonal to the upper surface S1 of the substrate S is referred to as the Z direction, one of directions orthogonal to the Z direction is referred to as the X direction, and a direction orthogonal to the Z direction and the X direction is referred to as the Y direction. Further, a direction which directs toward the first semiconductor region 10 from the substrate S is referred to as up (upper side), and a direction which directs toward the substrate S from the first semiconductor region 10 is referred to as down (lower side).

The first semiconductor region 10 includes the first portion 11 and a second portion 12. The first portion 11 is provided on a part of the second portion 12. The first portion 11 is a JFET (Junction Field Effect Transistor) region of the DIMOSFET. The second portion 12 is a drift region of the DIMOSFET.

The second semiconductor region 20 is provided on the first semiconductor region 10. The second semiconductor region 20 extends along the X direction (see FIG. 2). The second semiconductor region 20 includes a channel section 21. The channel section 21 is a part of the DIMOSFET channel. The channel section 21 is provided adjacent to the first portion 11 and has a first impurity concentration. The second semiconductor region 20 includes SiC of the second conductivity type (p-type). That is, the second semiconductor region 20 is provided in a part other than the part in which the first portion 11 is provided, on the second portion 12. The second semiconductor region 20 is a p-type well of the DIMOSFET.

The third semiconductor region 30 is provided on the second semiconductor region 20. The third semiconductor region 30 extends along the X direction (see FIG. 3). The third semiconductor region 30 is provided above a surface layer portion of the second semiconductor region 20 and includes SiC of the first conductivity type. The third semiconductor region 30 is a source region of the DIMOSFET.

In the semiconductor device 110, the third semiconductor region 30 includes a high resistance region 31, and a low resistance region 32 which has a resistance value lower than that of the high resistance region 31. The high resistance region 31 is an n+-type, and the low resistance region 32 is an n++-type. The high resistance region 31 is provided on a second region 52 which will be described later. The low resistance region 32 is provided on a region which is not the upper side of the second region 52 (which will be described later), but on the second semiconductor region 20.

The fourth semiconductor region 40 is provided on a side which is opposite to the channel section 21 of the third semiconductor region 30, at an inner side from outer edges e2 of the second semiconductor region 20. The fourth semiconductor region 40 includes SiC of the second conductivity type. The fourth semiconductor region 40 has a p++-type which has an impurity concentration higher than that of the second semiconductor region 20, and is used as a contact region with the first electrode D1 (which will be described later).

The second semiconductor region 20 includes a high concentration region 50. The high concentration region 50 is a region of the second semiconductor region 20 which is in contact with the third semiconductor region 30 and the fourth semiconductor region 40. The impurity concentration of the high concentration region 50 is higher than the impurity concentration of a region of the second semiconductor region 20 which is in contact with the first portion 11. That is, the second semiconductor region 20 has the high concentration region 50 having an impurity concentration (second impurity concentration) higher than the impurity concentration (first impurity concentration) of the channel section 21. The high impurity concentration 50 includes SiC of the second conductivity type (p+-type or p++-type). The high concentration region 50 includes a first region 51 and the second region 52.

The first region 51 is provided between the channel section 21 and the third semiconductor region 30. The first region 51 functions as a channel buffer of the DIMOSFET. In the semiconductor device 110 according to the embodiment, the channel includes the channel section 21 and the first region 51 which functions as the channel buffer.

Low on-resistance and high breakdown voltage are realized by providing the first region 51 which functions as the channel buffer.

The second region 52 which is a part of the high concentration region 50 electrically connects the first region 51 to the fourth semiconductor region 40.

The first region 51 is provided along the side of the channel section 21 of the third semiconductor region 30. The second region 52 is a by-pass region where the first region 51 is electrically connected to the fourth semiconductor region 40. As shown in FIG. 2, the second region 52 is provided to connect a part of the first region 51 to a part of the fourth semiconductor region 40. The second region 52 is provided on the lower side of the third semiconductor region 30. Specifically, the second region 52 is provided on the lower side of the high resistance region 31 of the third semiconductor region 30 as viewed in the Z direction.

In the semiconductor device 110 in which the second region 52 is provided, when the semiconductor device 110 is in an off-state, holes (positive holes) in the second semiconductor region 20 flow to the fourth semiconductor region 40 through the second region 52. Thus, avalanche resistance of the semiconductor device 110 is improved.

An insulating film 60 is provided on the first semiconductor region 10, the second semiconductor region 20, and the third semiconductor region 30. When an upper surface, where the first portion 11 of the first semiconductor region 10 is exposed and the XY plane which is an extension plane thereof, is represented as a first main surface 10a, the insulating film 60 has a portion which is continuously provided along the first main surface 10a. A part of the insulating film 60 which is provided between the first main surface 10a and the control electrode G (which will be described later) is a DIMOSFET gate insulating film. Further, the insulating film 60 functions as a film which forms insulation between the control electrode G and the first electrode D1 (which will be described later).

The control electrode G is provided on the insulating film 60. That is, the control electrode G is provided through the part (gate insulating film) of the insulating film 60 which is provided on the main surface 10a. Thus, the control electrode G functions as a gate electrode of the DIMOSFET.

The first electrode D1 is electrically connected to the third semiconductor region 30. The first electrode D1 is electrically insulated from the control electrode G by the insulating film 60. The first electrode D1 is in contact with the third semiconductor region 30 which is exposed to the first main surface 10a. The first electrode D1 is a source electrode of the DIMOSFET.

Here, since the high resistance region 31 is provided on the second region 52, the first electrode D1 obtains a superior contact through the low resistance region 32 of the third semiconductor region 30.

In the embodiment, the first electrode D1 is also in contact with the fourth semiconductor region 40 which is exposed to the first main surface 10a. Thus, the first electrode D1 functions as a common electrode of the source region and the p-type well of the DIMOSFET.

The second electrode D2 is electrically connected to the first semiconductor region 10. The first semiconductor region 10 is connected to the substrate S on a second main surface 10b which is a surface opposite to the first main surface 10a of the first semiconductor region 10. The second electrode D2 is provided on a lower surface S2 opposite to the upper surface S1 of the substrate S. The second electrode D2 is a drain electrode of the DIMOSFET.

In the semiconductor device 110 according to the embodiment, one pair of second semiconductor regions 20, one pair of third semiconductor regions 30, and one pair of fourth semiconductor regions 40 are provided, with the JFET region which is the first portion 11 being interposed therebetween. The JFET region is a region between the pair of second semiconductor regions 20 (one pair of channel sections 21).

Further, the insulating film 60 is continuously formed on the first portion 11, on one pair of second semiconductor regions 20 (one pair of channel sections 21 and one pair of first regions 51), and on one pair of third semiconductor regions 30. The control electrode G is provided on the insulating film 60. Accordingly, one pair of channels is controlled using one control electrode G.

Next, a specific example of the semiconductor device 110 will be described.

The substrate S is a hexagonal crystal SiC substrate (n$^+$ substrate) which includes, for example, nitrogen (N) as an n-type impurity, having an impurity concentration of approximately $5 \times 10^{18}$ cm$^{-3}$ or more and $1 \times 10^{19}$ cm$^{-3}$ or less.

On the upper surface S1 of the substrate S, there is formed the first semiconductor region 10 (n$^-$ layer) of the n-type having an impurity concentration of the n-type impurity of approximately $5 \times 10^{15}$ cm$^{-3}$ or more and $2 \times 10^{16}$ cm$^{-3}$ or less. The thickness of the first semiconductor region 10 is 5 μm or more and 10 μm or less, for example.

On the surface of a part of the first semiconductor region 10, there is formed the second semiconductor region 20 (p-type well) of the p-type having an impurity concentration of the p-type impurity of approximately $5 \times 10^{15}$ cm$^{-3}$ or more and $1 \times 10^{17}$ cm$^{-3}$ or less. The depth of the second semiconductor region 20 is approximately 0.6 μm, for example.

On the surface of a part of the second semiconductor region 20, there is formed the third semiconductor region 30 (source region) of the n-type having an impurity concentration of the n-type impurity of approximately $1 \times 10^{20}$ cm$^{-3}$. The third semiconductor region 30 is provided to be in parallel with the channel section 21 of the second semiconductor region 20. The depth of the third semiconductor region 30 is lower than the depth of the second semiconductor region 20, and for example, is approximately 0.3 μm.

Further, on the surface of a part of the second semiconductor region 20 and beside the third semiconductor region 30, there is formed the fourth semiconductor region (p-type well contact region) of the p-type having an impurity concentration of the p-type impurity of approximately $1 \times 10^{19}$ cm$^{-3}$ or more and $1 \times 10^{20}$ cm$^{-3}$ or less. The depth of the fourth semiconductor region 40 is lower than the depth of the second semiconductor region 20, and for example, is approximately 0.4 μm.

Further, the first region 51 of the p-type which is formed between the channel section 21 and the third semiconductor region 30 and has an impurity concentration higher than that of the channel section 21, on the front surface of the part of the second semiconductor region 20, is formed. The first region 51 is a channel buffer region.

Further, the insulating film 60 is formed to continuously cover the surfaces of the first semiconductor region 10, the second semiconductor region 20 and the third semiconductor region 30. As the insulating film 60, for example, silicon oxide, silicon nitride and high dielectric constant materials (high-k materials) are used.

Further, the control electrode G (gate electrode) is formed on the insulating film 60. As the control electrode G, for example, polycrystalline silicon and metallic materials (TiN, Al, Ru, W, TaSiN or the like) are used.

The channel section 21 and the first region 51 of the second semiconductor region 20 which is interposed between the third semiconductor region 30 and the first portion 11 under the control electrode G form the channel.

Further, the semiconductor device 110 includes the first electrode D1 (source region and p-type well common electrode) which is electrically connected to the low resistance region 32 of the third semiconductor region 30 and the fourth semiconductor region 40. The first electrode D1 includes a metal layer of nickel (Ni) and a metal layer of aluminum (Al) on the metal layer, for example. The first electrode D1 may include an alloy generated by reaction of the Ni metal layer and the Al metal layer. Further, the second electrode D2 (drain electrode) is formed on the side of the lower surface S2 of the substrate S.

In the embodiment, as the n-type impurity, for example, N or phosphorous (P) is favorable, but arsenic (As) or the like may be used. Further, as the p-type impurity, for example, Al is favorable, but boron (B) or the like may be used.

In the semiconductor device 110 according to the embodiment, the high concentration p-type first region 51 (channel buffer region) is formed on the side of the channel region of the third semiconductor region 30. Thus, for example, even though a channel length Lch of the semiconductor device 110 (see FIG. 3) has a size of 1.0 μm or less, leakage current is suppressed in an off-state. Accordingly, low on-resistance and stable breakdown voltage are realized.

In the semiconductor device 110 according to the embodiment, it is desired that the impurity concentration of the channel section 21 in the second semiconductor region 20 is $5 \times 10^{15}$ cm$^{-3}$ or more and $1 \times 10^{17}$ cm$^{-3}$ or less, and that the impurity concentration of the first region (channel buffer region) is $1 \times 10^{18}$ cm$^{-3}$ or more and $1 \times 10^{19}$ cm$^{-3}$ or less. It is desired that the impurity concentration of the lower side of the second region 52 of the second semiconductor region 20 is $1 \times 10^{17}$ cm$^{-3}$ or more and $5 \times 10^{18}$ cm$^{-3}$ or less.

If the impurity concentration of the channel section 21 is out of the above-mentioned range, it is difficult to set an appropriate threshold voltage of the MOSFET, which is not desired. Here, the impurity concentration means a concentration compensated with N or P.

Further, if the impurity concentration of the first region 51 (channel buffer region) is below the above-mentioned range, it is difficult to realize sufficient breakdown voltage, which is not desired. Further, if the impurity concentration of the first region 51 exceeds the range, the on-resistance may be excessively increased, which is not desired.

From the viewpoint of realizing low on-resistance and high-breakdown voltage, it is desired that the impurity concentration of the first region (channel buffer region) 51 is two or more digits higher than the impurity concentration of the channel section 21.

The impurity concentration of the channel section 21 may be evaluated by SIMS (Secondary Ion Mass Spectrometry) analysis, for example. The impurity concentration of the channel section 21 is represented by the impurity concentration of the central portion of the channel region under the insulating film 60. Further, the impurity concentration of the first region 51 is represented by a maximum impurity between the channel section 21 and the third semiconductor region 30.

In a case where the distance between a boundary of the first portion 11 and the second semiconductor region 20, and a boundary of the third semiconductor region 30 and the first region (channel buffer region) 51, immediately under the insulating film 60, is set to the channel length Lch (see FIG. 3), it is desired that the length (Lcb shown in FIG. 3) of the first region (channel buffer region) 51 is 0.1×Lch or more and 0.2×Lch or less.

If the length Lcb of the channel buffer region is below the above-mentioned range, it is difficult to realize sufficient breakdown voltage, which is not desired. Further, if the length Lcb of the channel buffer region exceeds the range, the on-resistance may be excessively increased, which is not desired.

If the channel length Lch or the length Lcb of the channel buffer region is determined by impurity concentration distribution obtained by SIMS analysis or the like, for example. The length Lcb of the channel buffer region is set to the length of a region which has an impurity concentration one digit higher than the impurity concentration of the channel section 21.

Further, in the embodiment, it is desired that the channel length Lch is less than 0.5 μm. Particularly, this is because a notable reduction in on-resistance and reduction in leakage current in the region are expected.

In the semiconductor device 110, in a state where a ground electric potential is applied to the first electrode D1, which is the source electrode, and a positive electric potential is applied to the second electrode D2, which is the drain electrode, if the voltage of the control electrode G is at a threshold value or higher, a channel is formed in the channel section 21. Thus, electrons are injected into the first semiconductor region 10 through the third semiconductor region 30 and the channel section 21 from the first electrode D1, and thus, the semiconductor device 110 is in the on-state.

On the other hand, if the voltage applied to the control electrode G is lower than the threshold value voltage, the channel is not formed in the channel section 21, and thus, the semiconductor device 110 is in the off-state. Here, the semiconductor device 110 is switched from the on-state to the off-state, electron-hole pairs may be generated in a depletion layer formed in the interface portion between the second semiconductor region 20 and the first semiconductor region 10. That is, if an electric potential difference between the third semiconductor region 30 and the first semiconductor region 10 is rapidly increased and temporarily exceeds the original electric potential difference in the off-state to enter an overvoltage state, electron-hole pairs may be generated due to carriers accelerated by an electric field in the depletion layer. If the generated carriers receive energy from the electric field again and a chain reaction generating the electron-hole pairs occurs, avalanche breakdown occurs.

In the semiconductor device 110, according to the embodiment, since the second region 52 is provided in the MOSFET which includes the first region 51 which functions as the channel buffer, the electric potential of the first region 51 is stable. Thus, changes in the electric field distribution of the first region 51 and the second semiconductor region 20 are suppressed with respect to the electric potential variation between the first semiconductor region 10 and the third semiconductor region 30, and a local electric field concentration in the semiconductor device 110 is suppressed. Further, even though holes are generated in the second semiconductor region 20 due to avalanche breakdown, it is possible to efficiently cause the holes to flow to the fourth semiconductor region 40 through the second region 52. Accordingly, avalanche resistance of the semiconductor device 110 is improved.

Figure 4:
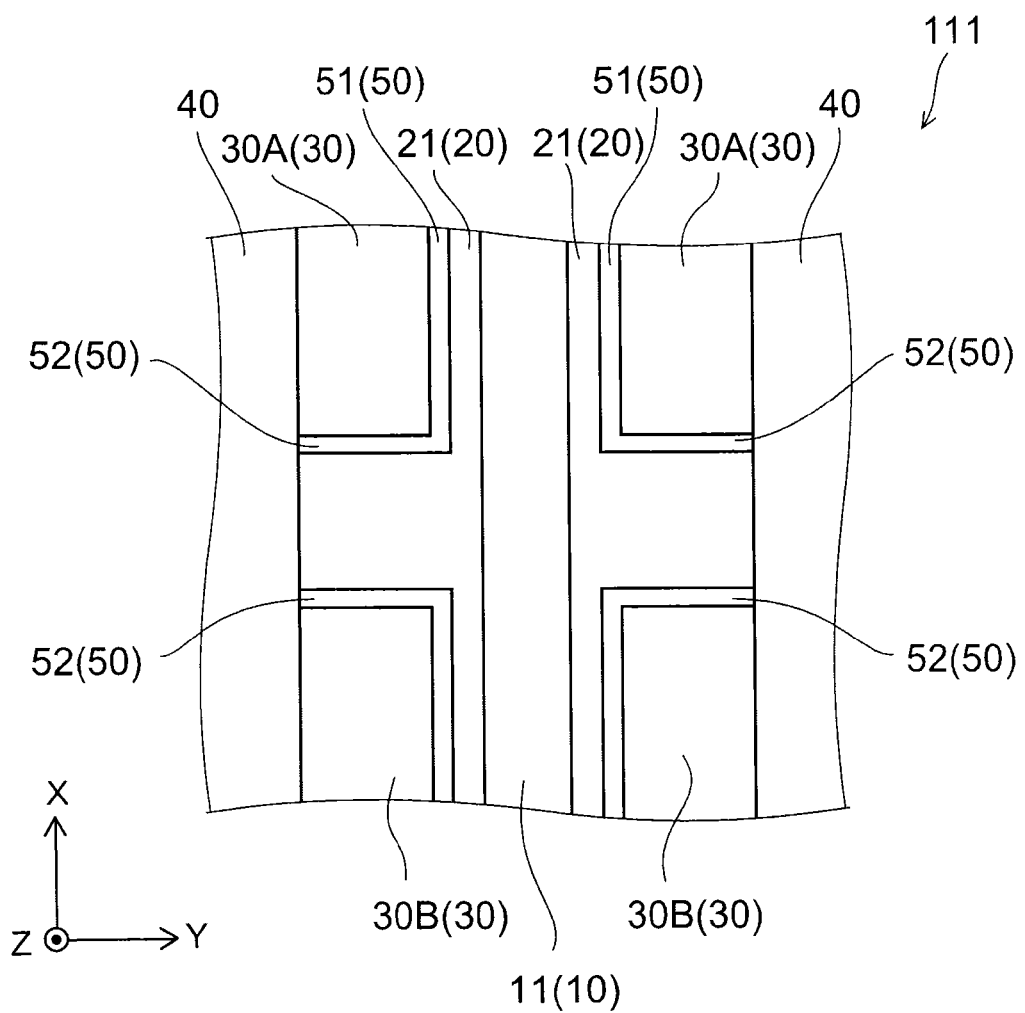
FIG. 4 is a plan view schematically illustrating another example (first example) of a semiconductor device according to the first embodiment.

FIG. 4 is a plan view schematically illustrating another example (first example) of a semiconductor device according to the first embodiment.

FIG. 4 is also a plan view schematically illustrating a semiconductor device 111 according to another example (first example), in which the insulating film 60, the control electrode G and the first electrode D1 are not shown.

The second semiconductor region 20 of the semiconductor device 111 extends in the X direction along the first main surface 10a. Further, the plurality of third semiconductor regions 30 of the semiconductor device 111 are provided to be spaced from each other in the X direction. FIG. 4 shows two third semiconductor regions 30A and 30B which are spaced from each other in the X direction.

The first region 51 of the high concentration region 50 is provided along the side of the first portion 11 of the third semiconductor region 30, and the second region 52 is provided between the plurality of third semiconductor regions 30A and 30B as viewed in the normal direction (Z direction) of the first main surface 10a.

According to the semiconductor device 111, low on-resistance and stable breakdown voltage are realized, and avalanche resistance is enhanced.

Figure 5:
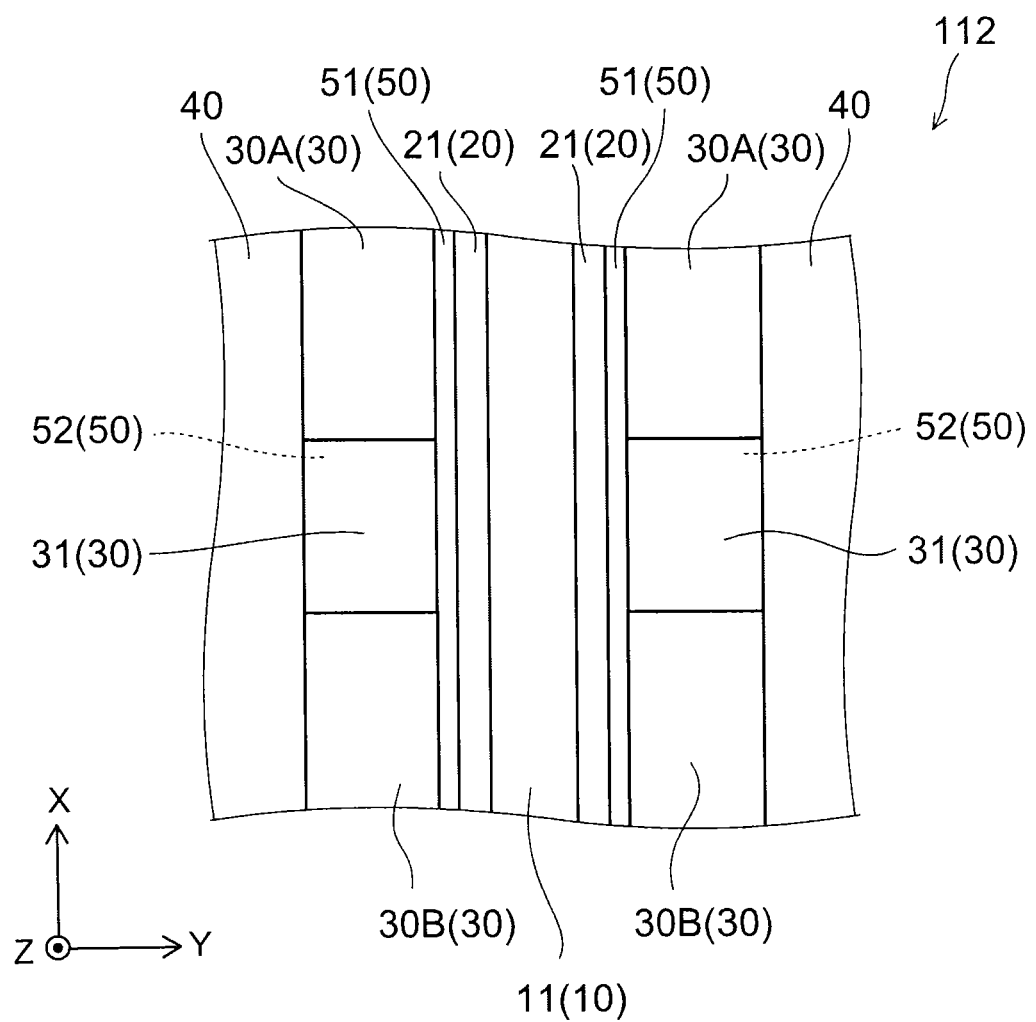
FIG. 5 is a plan view schematically illustrating another example (second example) of a semiconductor device according to the first embodiment.

FIG. 5 is a plan view schematically illustrating another example (second example) of a semiconductor device according to the first embodiment.

FIG. 5 is also a plan view schematically illustrating a semiconductor device 112 according to another example (second example), in which the insulating film 60, the control electrode G and the first electrode D1 are not shown.

As shown in FIG. 5, in the semiconductor device 112, the high resistance region 31 is provided between the plurality of third semiconductor regions 30A and 30B. The second region 52 is provided on the lower side of the high resistance region 31. Except for this configuration, the semiconductor device 112 is the same as the semiconductor device 111 shown in FIG. 4.

According to the semiconductor device 112, in addition to the improvement of avalanche resistance, compared with the semiconductor device 111, since electric current also flows to the high resistance region 31, reduction in on-resistance is achieved.

Figure 6:
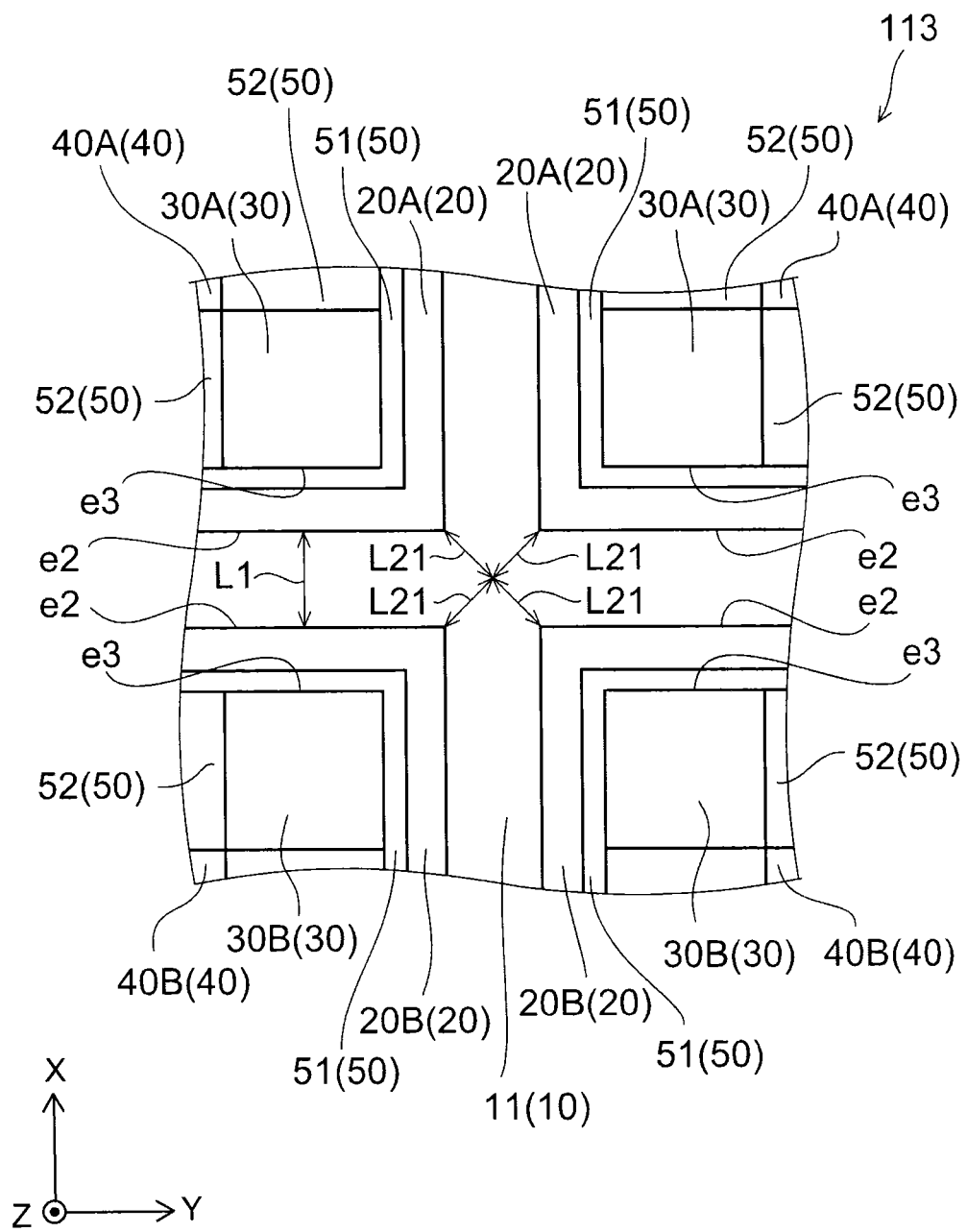
FIG. 6 is a plan view schematically illustrating another example (third example) of a semiconductor device according to the first embodiment.

FIG. 6 is a plan view schematically illustrating another example (third example) of a semiconductor device according to the first embodiment.

FIG. 6 is a plan view schematically illustrating a semiconductor device 113 according to another example (third example), in which the insulating film 60, the control electrode G and the first electrode D1 are not shown.

The plurality of semiconductor regions 20 of the semiconductor device 113 are provided to be spaced from each other in the X direction along the first main surface 10a. FIG. 6 shows two second semiconductor regions 20A and 20B which are spaced from each other in the X direction.

The plurality of second semiconductor regions 20 (20A and 20B) are provided in rectangular forms as viewed in the normal direction (Z direction) of the first main surface 10a. In the example shown in FIG. 6, the plurality of second semiconductor regions 20 are provided to be spaced from each other in the X direction and the Y direction, respectively. That is, the plurality of second semiconductor regions 20 are disposed in a matrix form as viewed in the Z direction. The first portion 11 is provided to face the outer edges e2 of the second semiconductor regions 20 (20A and 20B) as viewed in the Z direction.

The third semiconductor region 30 of the semiconductor device 113 is provided in a rectangular form inside the outer edges e2 of the second semiconductor regions 20 (20A and 20B) as viewed in the Z direction. That is, the third semiconductor region 30A is provided inside the outer edges e2 of the second semiconductor region 20A, and the third semiconductor region 30B is provided inside the outer edges e2 of the second semiconductor region 20B.

The fourth semiconductor region 40 is provided in a rectangular form inside outer edges e3 of the third semiconductor regions 30 (30A and 30B) as viewed in the Z direction. That is, the fourth semiconductor region 40A is provided inside the outer edges e3 of the third semiconductor region 30A, and the fourth semiconductor region 40B is provided inside the outer edges e3 of the third semiconductor region 30B.

Further, in the semiconductor device 113, the first region 51 of the high concentration region 50 is provided along the outer edges e3 of the third semiconductor region 30 as viewed in the Z direction. Further, the second region 52 of the high concentration region 50 is provided in the fourth semiconductor region 40 inside the outer edges e3 of the third semiconductor region as viewed in the Z direction. The plurality of second regions 52 may be provided with respect to one second semiconductor region 20. Further, for the third semiconductor region 30, the high resistance region 31 (not shown) may be provided on the second region 52.

According to the semiconductor device 113, in addition to the improvement of avalanche resistance, compared with the semiconductor device 112, the channel concentration is improved, and reduction in on-resistance is achieved.

Figure 7:
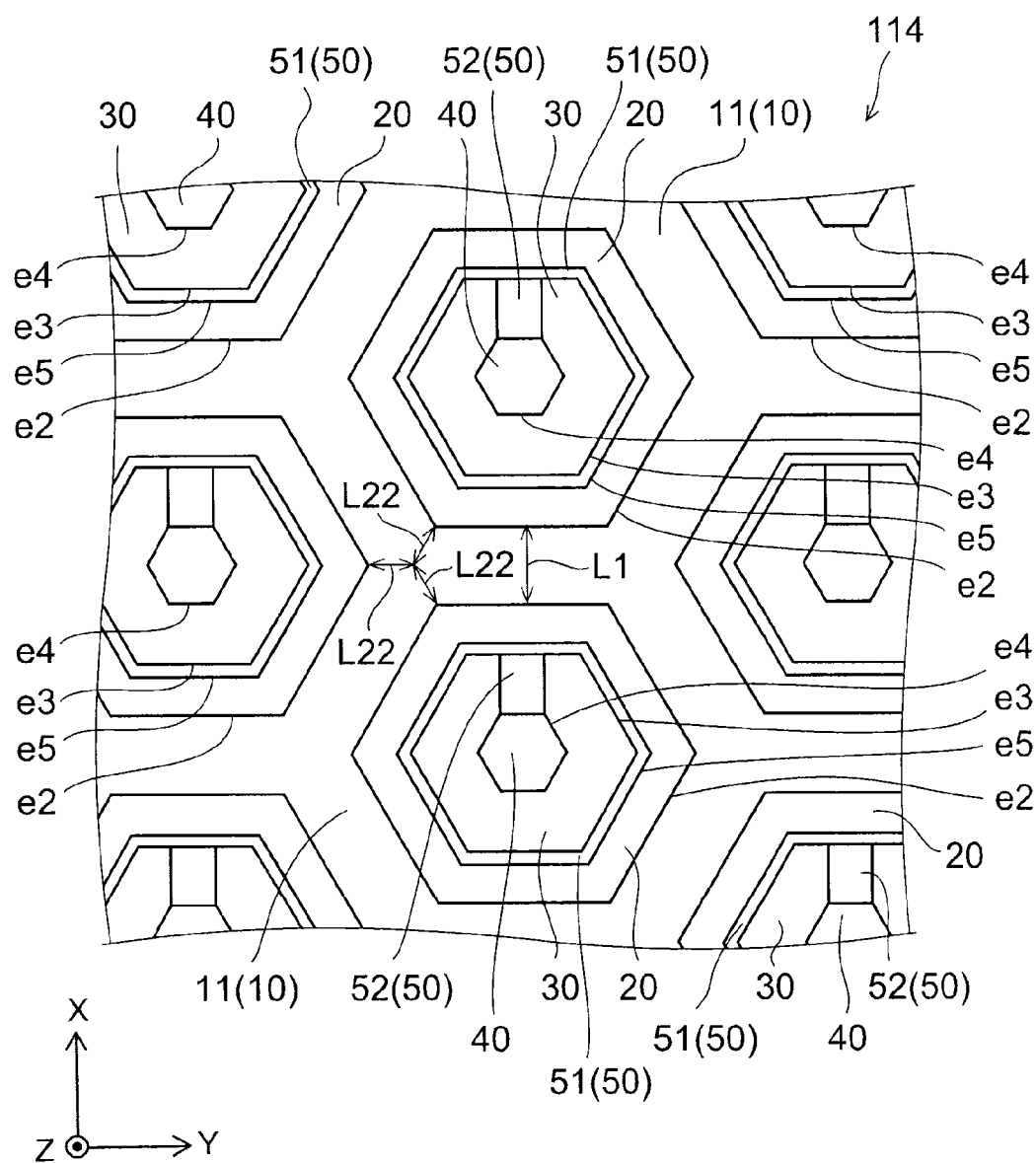
FIG. 7 is a plan view schematically illustrating another example (fourth example) of a semiconductor device according to the first embodiment.

FIG. 7 is a plan view schematically illustrating another example (fourth example) of a semiconductor device according to the first embodiment.

FIG. 7 is a plan view schematically illustrating a semiconductor device 114 according to another example (fourth example), in which the insulating film 60, the control electrode G and the first electrode D1 are not shown.

The plurality of second semiconductor regions 20 of the semiconductor device 114 are provided to be spaced from each other along the first main surface 10a. The outer edges e2 of the second semiconductor region 20 are provided in a hexagonal form as viewed in the Z direction. In the example shown in FIG. 7, in two adjacent second semiconductor regions 20, the plurality of second semiconductor regions 20 are disposed so that the sides of the hexagons face each other. The first portion 11 is disposed between the two adjacent second semiconductor regions 20.

The third semiconductor region 30 of the semiconductor device 114 is provided in a hexagonal form inside the outer edges e2 of the second semiconductor regions 20 as viewed in the Z direction. The fourth semiconductor region 40 is provided in a hexagonal form inside the outer edges e3 of the third semiconductor regions 30 as viewed in the Z direction.

Further, in the semiconductor device 114, the first region 51 of the high concentration region 50 is provided along the outer edges e3 of the third semiconductor region 30 as viewed in the Z direction. Further, the second region 52 of the high concentration region 50 is provided in the fourth semiconductor region 40 inside the outer edges e3 of the third semiconductor region as viewed in the Z direction. The plurality of second regions 52 may be provided with respect to one second semiconductor region 20.

According to the semiconductor device 114, in addition to the improvement of avalanche resistance, compared with the semiconductor devices 111 and 112, the channel concentration is improved, and reduction in on-resistance is achieved.

Further, in the semiconductor devices 113 and 114, in a case where the interval between two second semiconductor regions 20, which face each other as viewed in the Z direction, is the same L1, with respect to the respective corner portions which face each other, of the plurality of adjacent second semiconductor regions 20, intervals between the respective corner portions and a point equidistant from the respective corner portions, (an interval L21 shown in FIG. 6 in the semiconductor device 113, and an interval L22 shown in FIG. 7 in the semiconductor device 114) satisfy the relationship of L22<L21.

Specifically, the interval L21 is $L1/\sqrt{2}$. The interval L22 is $L1/\sqrt{3}$.

As the interval L22 is shorter than the interval L21, in the semiconductor device 114, the electric field applied to the insulating film 60 which is on the upper side of the first portion 11 is alleviated compared with the semiconductor device 113. Thus, the reliability of the semiconductor device 114 is enhanced.

In the semiconductor device 114 shown in FIG. 7, the outer edges e4 and e5 of the second semiconductor region 20, the third semiconductor region 30, the fourth semiconductor region 40 and the first region 51 of the high concentration region 50, as viewed in the Z direction, are provided in a hexagonal form, respectively, but other polygonal forms may be provided.

Second Embodiment

Figure 8:
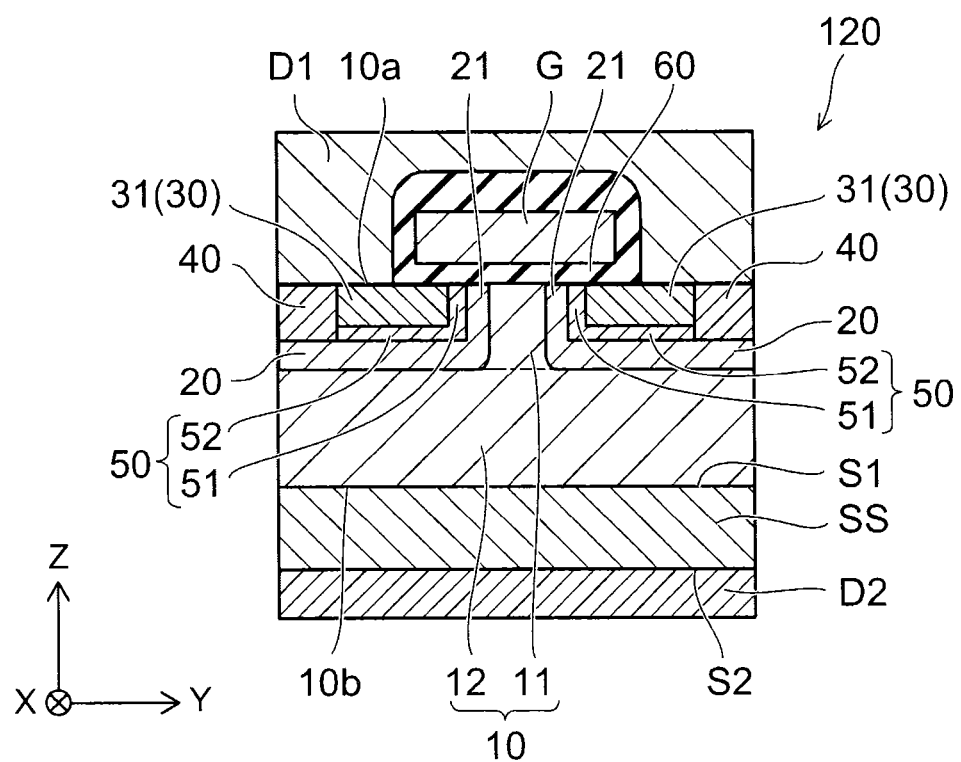
FIG. 8 is a cross-sectional view schematically illustrating a semiconductor device according to a second embodiment.

FIG. 8 is a cross-sectional view schematically illustrating a semiconductor device according to a second embodiment.

As shown in FIG. 8, a semiconductor device 120 according to the second embodiment is an IGBT (Insulated Gate Bipolar Transistor).

In the semiconductor device 120, a conductivity type of a substrate SS is different from the conductivity type of the substrate S of the semiconductor device 110 according to the first embodiment. That is, the conductivity type of the substrate SS of the semiconductor 120 is the $p^+$-type, whereas the conductivity type of the substrate S of the semiconductor device 110 is the $n^+$-type. The semiconductor device 120 is the same as the semiconductor device 110 except that the conductivity types of the substrates S and SS are different from each other.

The substrate SS is a hexagonal crystal SiC substrate which includes for example, Al, as a p-type impurity, having an impurity concentration of approximately $5\times10^{18}$ cm$^{-3}$ or more and $1\times10^{19}$ cm$^{-3}$ or less. In the semiconductor device 120 which is the IGBT, the control electrode G is a gate electrode, the first electrode D1 is an emitter electrode, and the second electrode D2 is a collector electrode. In the semiconductor device 120, low on-resistance and stable breakdown voltage are realized, and avalanche resistance is enhanced, in a similar way in the semiconductor device 110.

As described above, according to the semiconductors according to the embodiments, it is possible to achieve low on-resistance and to realize stable breakdown voltage, and to enhance avalanche resistance.

The embodiments have been described as above, but the invention is not limited to these examples. For example, in the above-described respective embodiments, addition, deletion or design change of components appropriately performed, or a combination of characteristics of the respective embodiments appropriately performed by those skilled in the art is included in the scope of the invention as long as it falls within the spirit of the invention.

For example, in the above-described respective embodiments, the first conductivity type is the n-type and the second conductivity type is the p-type, but the invention may also be applied to a case where the first conductivity type is the p-type and the second conductivity type is the n-type. Further, the semiconductor devices 110, 111, 112, 113 and 114 may also be applied to the MOSFET other than the DIMOSFET.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a first semiconductor region including silicon carbide of a first conductivity type, the first semiconductor region having a first portion;
    a second semiconductor region provided adjacent to the first portion on the first semiconductor region, the second semiconductor region including silicon carbide of a second conductivity type;
    a third semiconductor region provided spaced from the first portion on the second semiconductor region, the third semiconductor region including silicon carbide of the first conductivity type;
    a fourth semiconductor region provided on the second semiconductor region, the fourth semiconductor region including silicon carbide of the second conductivity type;
    an insulating film provided on the first semiconductor region, the second semiconductor region and the third semiconductor region;
    a control electrode provided on the insulating film;
    a first electrode electrically connected to the third semiconductor region; and
    a second electrode electrically connected to the first semiconductor region,
    the second semiconductor region having a first region and a second region, the first region contacting with the third semiconductor region and the fourth semiconductor region, the second region contacting with the first portion,
    an impurity concentration of the first region being higher than an impurity concentration of the second region,
    wherein the third semiconductor region includes a high resistance region and a low resistance region, the low resistance region having a lower resistance value than the high resistance region.

2. The semiconductor device according to claim 1, wherein the first semiconductor region includes a first main surface, and
    a plurality of the second semiconductor regions are provided, and the plurality of the second semiconductor regions are provided spaced from each other along the first main surface.

3. The semiconductor device according to claim 1, wherein the first semiconductor region includes a first main surface, a plurality of the third semiconductor regions is provided, and the plurality of the respective third semiconductor regions are provided spaced from each other in a first direction along the first main surface, and
    the second semiconductor region includes a portion extending in the first direction and a portion provided between the plurality of third semiconductor regions as viewed in a normal direction of the first main surface.

4. The semiconductor device according to claim 1, wherein a pair of the second semiconductor regions, a pair of the third semiconductor regions and a pair of the fourth semiconductor regions are provided.

5. The semiconductor device according to claim 1, wherein the second semiconductor region electrically connects the fourth semiconductor region and the first region.

6. The semiconductor device according to claim 1, wherein
    the second semiconductor region extends in a first direction along a first main surface,
    the third semiconductor region extends in the first direction, and
    the first region extends in the first direction.

7. The semiconductor device according to claim 1, wherein
    the second semiconductor region extends in a first direction along the first main surface,
    the third semiconductor region extends in the first direction, and
    the first region extends in the first direction.

8. The semiconductor device according to claim 1, wherein the first semiconductor region includes a first main surface,
    outer edges of the second semiconductor region are provided in a hexagonal form as viewed in a normal direction of the first main surface, and
    the fourth semiconductor region is provided at an inner side from the outer edges of the second semiconductor region.

9. The semiconductor device according to claim 1, wherein the first semiconductor region includes a first main surface,
    a plurality of the third semiconductor regions is provided, and the plurality of the respective third semiconductor regions are provided spaced from each other in a first direction along the first main surface, and
    the second semiconductor region includes a portion extending in the first direction and a portion provided between the plurality of third semiconductor regions as viewed in a normal direction of the first main surface.

10. The semiconductor device according to claim 1, wherein a plurality of the second semiconductor regions is provided, and a plurality of the second semiconductor regions are provided spaced from each other in a first direction along the first main surface and in a second direction orthogonal to the first direction along the first main surface, respectively.

11. The semiconductor device according to claim 1, wherein
    an impurity concentration of the second semiconductor region on the side of the first portion is $5 \times 10^{15}$ cm$^{-3}$ or more and $1 \times 10^{17}$ cm$^{-3}$ or less, and
    an impurity concentration of the first region is $1 \times 10^{18}$ cm$^{-3}$ or more and $1 \times 10^{19}$ cm$^{-3}$ or less.

12. The semiconductor device according to claim 1, wherein a first length of the first region in a second direction connecting the third semiconductor region and the first portion is 0.1 times or more and 0.2 times or less than a second length in the second direction, the second length being between a boundary of the third semiconductor region and the first region and a boundary of the first portion and the channel section.

13. The semiconductor device according to claim 12, wherein the second length is less than 0.5 µm.

14. The semiconductor device according to claim 1, wherein
the first semiconductor region includes a first main surface,
outer edges of the second semiconductor region are provided in a rectangular form as viewed in a normal direction of the first main surface, and
the fourth semiconductor region is provided at an inner side from the outer edges of the second semiconductor region.

15. The semiconductor device according to claim 14, wherein the first portion is provided to face the outer edges of the second semiconductor region as viewed in the normal direction.

16. The semiconductor device according to claim 14, wherein the first region is provided along the outer edges of the second semiconductor region as viewed in the normal direction.

17. The semiconductor device according to claim 1, further comprising a substrate disposed between the first semiconductor region and the second electrode, the substrate including silicon carbide.

18. The semiconductor device according to claim 17, wherein the substrate has a conductivity type of the first conductivity type.

19. The semiconductor device according to claim 17, wherein the substrate has a conductivity type of the second conductivity type.

* * * * *